United States Patent [19]

Savignac et al.

[11] Patent Number: 5,289,037
[45] Date of Patent: Feb. 22, 1994

[54] CONDUCTOR TRACK CONFIGURATION FOR VERY LARGE-SCALE INTEGRATED CIRCUITS

[75] Inventors: Dominique Savignac, Ismaning; Manfred Menke, München; Armin Kohlhase, Ottobrunn, all of Fed. Rep. of Germany; Hanno Melzner, Wappingers Falls, N.Y.

[73] Assignee: Siemens Aktiengesellschaft, Munich, Fed. Rep. of Germany

[21] Appl. No.: 883,113

[22] Filed: May 14, 1992

[30] Foreign Application Priority Data

May 15, 1991 [DE] Fed. Rep. of Germany ....... 4115909

[51] Int. Cl.$^5$ ............................................. H01L 23/48
[52] U.S. Cl. ................................. 257/776; 257/758; 257/773
[58] Field of Search ................... 257/758, 773, 776

[56] References Cited

U.S. PATENT DOCUMENTS 4,827,449 5/1989 Inoue .
4,914,503 4/1990 Shirato et al. .
5,148,260 9/1992 Inoue et al. ...................... 257/776

FOREIGN PATENT DOCUMENTS 0048610 1/1986 European Pat. Off. .
3933178 4/1990 Fed. Rep. of Germany .

OTHER PUBLICATIONS

Siemens Technical Information 11.86 1-Mbit DRAM with CMOS Technology, pp. 1-11, Order No. B2-B36-43-X-X-7600.

Primary Examiner—Edward Wojciechowicz
Attorney, Agent, or Firm—Herbert L. Lerner; Laurence A. Greenberg

[57] ABSTRACT

A conductor track configuration for very large-scale integrated circuits includes at least two lower conductor tracks extending substantially in a first direction and at least two upper conductor tracks extending substantially in the first direction above the lower conductor tracks. Each of the lower conductor tracks is subdivided into segments, defining gaps between the segments. Each respective one of the segments has one contact leading to the upper conductor track disposed above the one segment. The lower conductor tracks adjacent the segments, as seen in a second direction, have one of the gaps at least in the vicinity of one of the contacts.

11 Claims, 3 Drawing Sheets

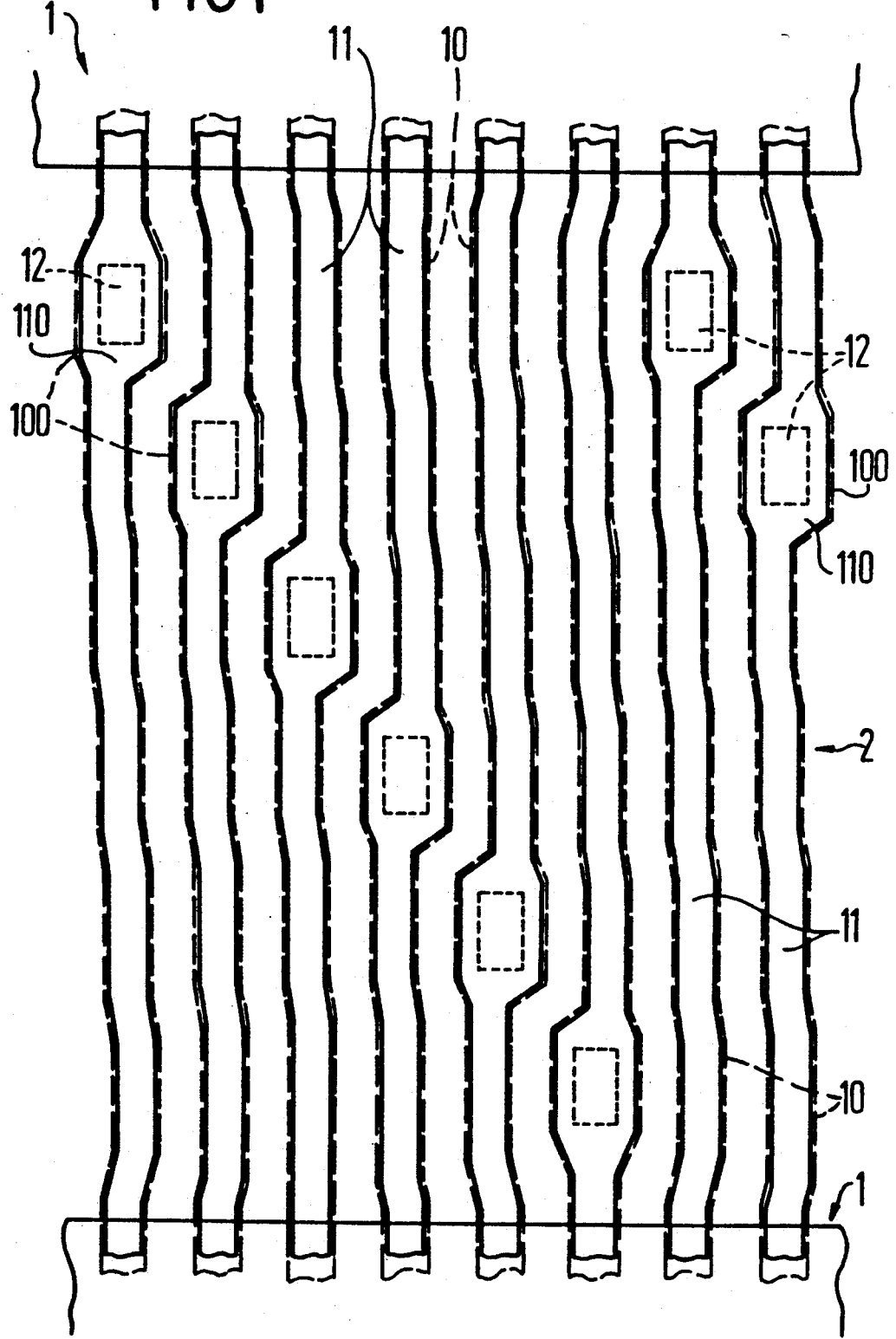

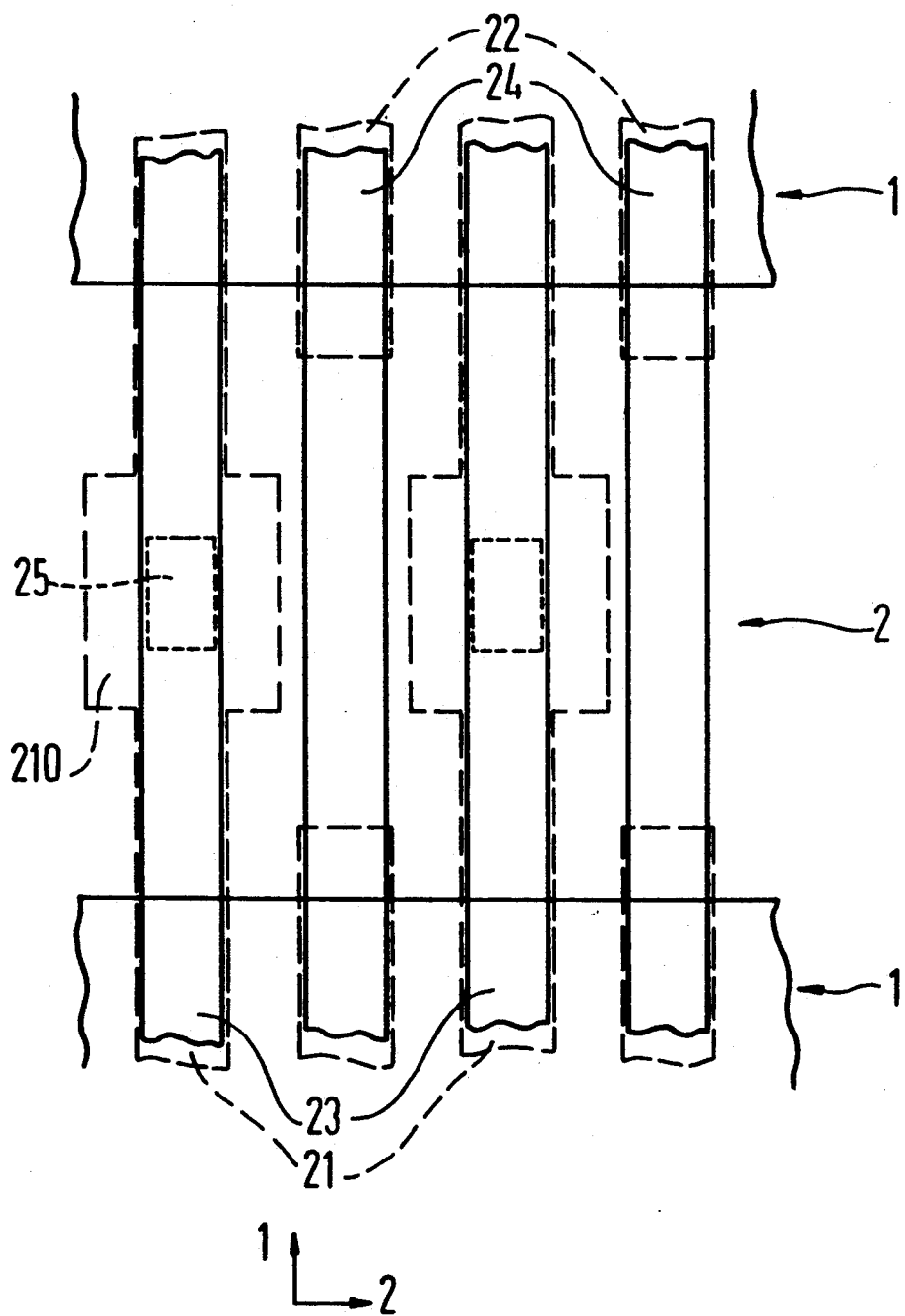

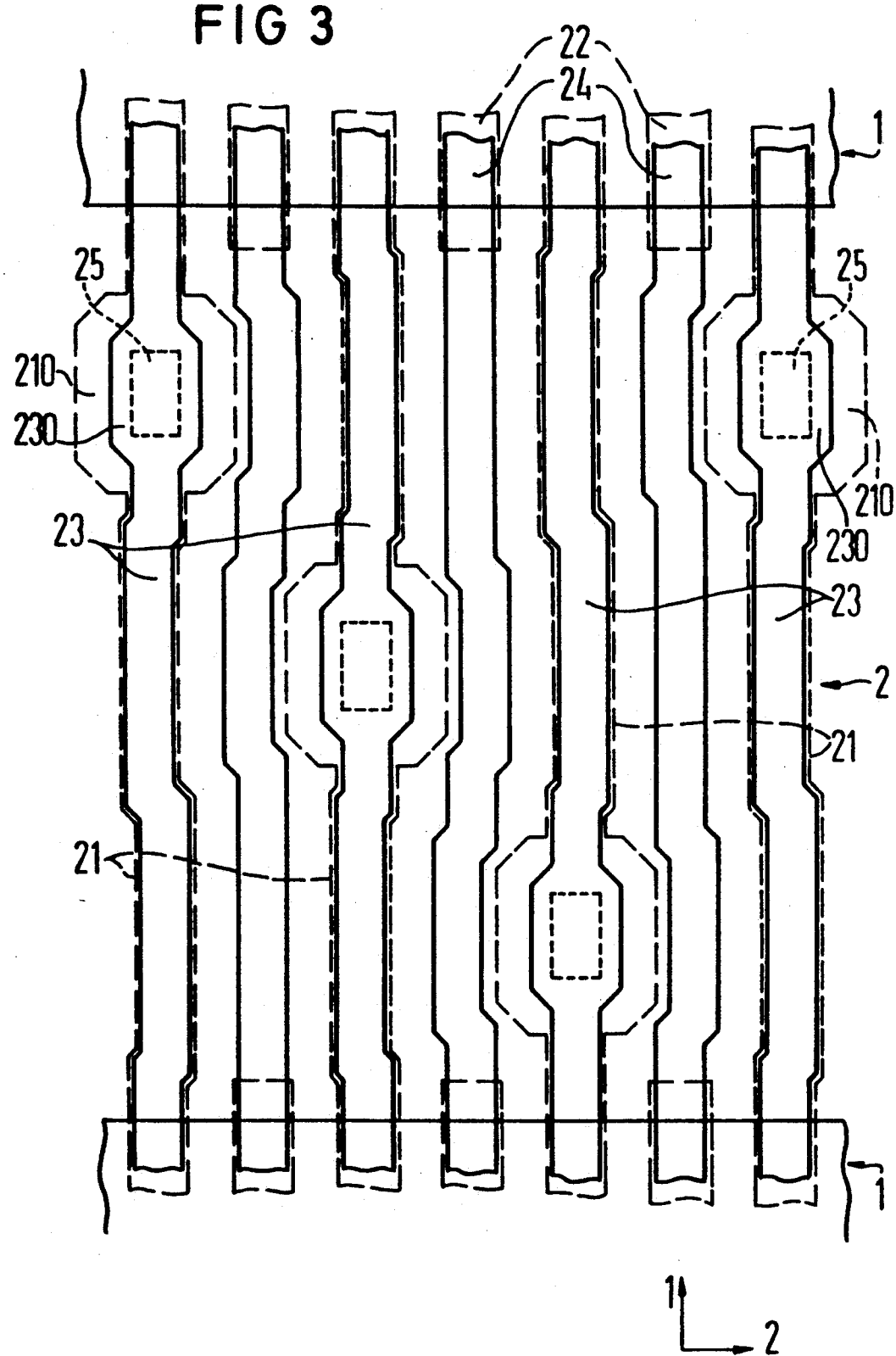

CONDUCTOR TRACK CONFIGURATION FOR VERY LARGE-SCALE INTEGRATED CIRCUITS

The invention relates to a conductor track configuration for very large-scale integrated (VLSI) circuits, having at least two lower conductor tracks extending essentially in a first direction and at least two upper conductor tracks extending above them in the first direction.

In very large-scale integrated circuits, conductor tracks for triggering certain cells should have the smallest possible electrical resistance. However, for various reasons, especially having to do with process technology, it is impossible to produce the conductor tracks from a material with sufficiently low resistance. One example is word lines that are generally formed of polycrystalline tracks in a semiconductor memory array in a semiconductor substrate that is formed of silicon. In order to reduce the electrical resistance, the word line is therefore typically bonded at certain points to an aluminum track overlying it (see, for instance, the publication entitled: Siemens Technical Information, 1 Mbit DRAM, Ordering No. B2-B3643-X-X-7600). Such points are typically located outside the memory cells, which are disposed in fields, and specifically in the form of so-called wiring fields between every two cell fields.

It is accordingly an object of the invention to provide a conductor track configuration for very large-scale integrated circuits, which overcomes the hereinafore-mentioned disadvantages of the heretofore-known devices of this general type and which provides a configuration of the lower and upper conductor tracks and the contacts between them which occupies little space yet is highly insensitive to maladjustment of lower conductor tracks, contact holes and upper conductor tracks relative to one another.

With the foregoing and other objects in view there is provided, in accordance with the invention, a conductor track configuration for very large-scale integrated circuits, comprising at least two lower conductor tracks extending substantially in a first direction; at least two upper conductor tracks extending substantially in the first direction above the lower conductor tracks; each of the lower conductor tracks being subdivided into segments, defining gaps between the segments; each respective one of the segments having one contact leading to the upper conductor track disposed above the one segment; and the lower conductor tracks adjacent the segments, as seen in a second direction, having one of the gaps at least in the vicinity of one of the contacts.

In accordance with another feature of the invention, there is provided a succession of cell fields and intervening wiring fields through which each of the conductor tracks extend, the gaps and the contacts being disposed solely in the wiring fields.

In accordance with a further feature of the invention, the wiring fields include a first wiring field and a second wiring field following the first wiring field in the first direction; the lower conductor tracks include even-numbered and odd-numbered lower conductor tracks; in the first wiring field, every other or the even-numbered lower conductor tracks each have one of the gaps and the intervening or odd-numbered lower conductor tracks each have one of the contacts leading to the upper conductor track disposed above the the odd-numbered lower conductor track; and in the second wiring field, every even-numbered lower conductor track has one of the contacts and every odd-numbered lower conductor track has one of the gaps.

In accordance with an added feature of the invention, the gaps each extend over a predominant portion of one of the wiring fields.

In accordance with an additional feature of the invention, the adjacent contacts are mutually offset forming a staggered configuration.

In accordance with yet another feature of the invention, the each three adjacent contacts are mutually staggered forming a triple staggered configuration.

In accordance with yet a further feature of the invention, the lower and/or upper conductor tracks are widened into contact areas in the vicinity of the contacts.

In accordance with a concomitant feature of the invention, the lower and upper conductor tracks have a wavy course.

Other features which are considered as characteristic for the invention are set forth in the appended claims.

Although the invention is illustrated and described herein as embodied in a conductor track configuration for very large-scale integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a fragmentary, diagrammatic, top-plan view of a configuration of lower and upper conductor tracks in a wiring field;

FIGS. 2 and 3 are views similar to FIG. 1 showing two other embodiments of the conductor track configuration according to the invention.

Referring now in detail to the figures of the drawing, in which identical elements are identified by the same reference numerals, and first, particularly, to FIG. 1 thereof, there is seen a portion of a wiring field 2 between cell fields 1, with a configuration of polysilicon word lines 10 (lower conductor tracks), aluminum word lines 11 (upper conductor tracks), and contacts 12 between each polysilicon word line 10 and an overlying aluminum word line 11. Outside the contacts 12, the lower and upper conductor tracks 10, 11 are electrically insulated from one another by an insulating layer. In one wiring field 2, every lower conductor track 10 is connected to an upper conductor track 11 through precisely one contact 12, due to the fact that before the upper conductor track 11 is formed at that point, a contact hole 12 is produced in the insulating layer, for instance by an etching process. At the contact 12, the lower conductor track 10 must be widened to make a contact area 100, due to a possible maladjustment of the contact hole 12 relative to the lower conductor track 10. At the same time, the conductor track grid pattern should be as small as possible, and in particular should match the conductor track grid across the cell field 1. In general, the upper conductor track 11 is likewise widened to make a contact area 110. The configuration of the contacts 12 shown in FIG. 1, is in a sextuple-staggered pattern (that is, the contacts of adjacent conductor tracks are offset from one another, and the pattern is repeated after every six conductor tracks), in which the specialized form of the contact areas 100, 110 and the wavy (in other words essentially rectilinear) course of the conductor tracks 10, 11 are already largely optimized in terms of these requirements.

In the wiring field 2, in further underlying layers, other electrically relevant structures are generally provided, and in semiconductor memory arrays one such structure is typically a polysilicon layer (which is a so-called polysilicon plate) that is connected to one electrode of memory capacitors. If the possible maladjustment of the contacts 12 is greater than or equal to the widening attained at the contact area 100 on the corresponding side of the lower conductor track 10, then a danger exists that the contact hole next to the contact area will be etched through as far as the underlying polysilicon plate. After the upper conductor track 11 is formed, a short circuit to the polysilicon plate leading to a functional failure would then exist at that point. Enlargement of the contact surface 100 of the lower conductor track is hindered by the requirement for a minimum spacing between adjacent lower conductor tracks and by the structural fineness attainable by phototechnical processes.

FIG. 2 is a top-plan view of a portion of a wiring field 2 between two cell fields which shows lower conductor tracks 21, 22 (shown in dashed lines) extending in a first direction (given reference numeral 1 in a diagram at the bottom of FIG. 2), and overlying upper conductor tracks 23, 24. According to the invention, in one wiring field 2, every other lower conductor track 22 (the even-numbered ones) is subdivided, in other words it has a gap. The lower conductor track 21 (odd-numbered conductor tracks) which is adjacent to the track 22, as seen in a second direction (given reference numeral 2 in the diagram at the bottom of FIG. 2) that is at right angles to the first direction, is continuous in the wiring field and has a contact area 210 in the vicinity of the gap in the track 22. This pattern of odd lower conductor tracks 21 having the contact area 210 and even lower conductor tracks 22 having the gap is repeated periodically in the second direction. The upper conductor tracks 23, 24 extend rectilinearly over the lower conductor tracks. At the location of the contact area 210, there is a contact 25 leading to the lower conductor track. The contact can be produced in the manner described in conjunction with FIG. 1. Accordingly, in one wiring field 2, only every other upper conductor track 23 is bonded to every other lower conductor track 21, or in other words there is one contact 25 that is only between the odd lower and upper conductor tracks. In the wiring field which follows in the first direction and is separated from the wiring field 2 shown in the drawing by the cell field 1, the even-numbered lower conductor tracks 22 are laid continuously and have a contact leading to the respectively overlying even-numbered upper conductor track 24. Correspondingly, in the vicinity of such a contact, the odd-numbered lower conductor tracks 21 have a gap.

According to the invention, every lower conductor track 21, 22 is accordingly laid in segments that are separated from one another by gaps. In this embodiment, each segment extends across two cell fields and the intervening wiring field. In the intervening wiring field, the segment has a contact with the overlying upper conductor track. The gaps that end the segment are disposed in the two (outer) wiring fields adjoining the aforementioned cell fields. The lower conductor track which is adjacent thereto in the second direction has one gap between two segments in the intervening wiring field, at least in the vicinity of the aforementioned contact, while in the outer wiring fields, each of these segments has one contact.

Due to the gaps, the contact areas 210 of the respective continuous lower conductor tracks can be sufficiently large in size, so that even with the maximum expected maladjustment of the contact hole 25 relative to the lower conductor track 21, the contact hole will still be located in the region of the contact area 210. Etching into the surroundings and a possible short-circuit to underlying structures can be precluded. The gap of a lower conductor track may extend over the entire wiring field 2.

Due to the fixed predetermined maximum transit time over a lower conductor track between a cell in the cell field and the contact, the length of a cell field in the first direction in such a conductor track configuration according to the invention need only be no more than half as large as in the previous configuration, because every cell has a contact to an upper conductor track on only one side of the cell field. Accordingly, instead of n wiring fields in the previous configuration, 2n+1 wiring fields are necessary in such a configuration according to the invention. In return, the length of a wiring field in the first direction can be greatly reduced, depending on the embodiment of the invention, because only every other conductor track has a contact area, and staggering may possibly be dispensed with entirely. In particular, the actual space requirement is dependent on the predetermined conductor track grid pattern and on the structural fineness that is attainable. The configuration according to the invention can be especially advantageously employed with very close conductor track grid patterns, for example in a 64M DRAM.

The configuration of such conductor tracks according to the invention does not change the electrical parameters as compared with the previous configuration, because the effective length of a lower conductor track remains the same size. The error rate resulting from a defective contact does not change either. Both in the previous configuration and such a configuration according to the invention, a failure of at least the involved cells is the result, because in the previous situation, the transit time for the cells in the vicinity of the defective or missing contact over the lower conductor track becomes greater by a factor of four, and a signal can no longer be read quickly enough.

In the embodiment shown in FIG. 3, the characteristics of the invention are advantageously combined with staggering of the contacts and a wavy course of the conductor tracks. A triple staggering is shown, so that the pattern repeats after six conductor tracks. In this exemplary embodiment, the upper conductor tracks 23 are also widened into contact areas 230.

This configuration assures reliable contacts even in the event of major adjustment errors. For example, the conductor track grid pattern amounts to 1.4 $\mu$m (conductor track width and spacing are each 0.7 $\mu$m), the contact area of a lower conductor track is 2.3 $\mu$m $\times$ 2.8 $\mu$m, and the contact hole 25 measures 0.7 $\mu$m $\times$ 1.2 $\mu$m. Accordingly, the contact hole 25 may be maladjusted by 0.8 $\mu$m in each of the four directions without protruding past the lower contact area 210. Since adjustment errors of this magnitude can be precluded with virtual certainty, the lower contact areas can generally be selected to be smaller, so that the overall configuration occupies less space. The upper contact areas 230 are 1.3 $\mu$m $\times$ 2.1 $\mu$m in size. In other words, if there is a maladjustment of 0.3 μm in the second direction and 0.45 μm in the first direction, the contact holes 25 are still fully covered. The spacing between two upper conductor tracks is at least 0.7 μm at all points.

We claim:

1. A conductor track configuration for very large-scale integrated circuits, comprising:
    a plurality of lower conductor tracks extending substantially in a first direction and being disposed side by side as seen in a second direction;
    at least two upper conductor tracks extending substantially in the first direction above said lower conductor tracks; and
    an insulating layer disposed between respective ones of said upper and lower conductor tracks;
    each of said lower conductor tracks being subdivided into segments, defining gaps between said segments;
    each respective one of said segments having one contact leading to said upper conductor track disposed above said one segment; and
    said gaps being formed substantially between two contacts of adjacent ones of said conductor tracks.

2. The conductor track configuration according to claim 1, including a succession of cell fields and intervening wiring fields through which each of said conductor tracks extend, said gaps and said contacts being disposed solely in said wiring fields.

3. The conductor track configuration according to claim 2, wherein said wiring fields include a first wiring field and a second wiring field following said first wiring field in the first direction;
    said lower conductor tracks include even-numbered and odd-numbered lower conductor tracks;
    in said first wiring field, said even-numbered lower conductor tracks each have one of said gaps and said odd-numbered lower conductor tracks each have one of said contacts leading to said upper conductor track disposed above said said odd-numbered lower conductor track; and
    in said second wiring field, every even-numbered lower conductor track has one of said contacts and every odd-numbered lower conductor track has one of said gaps.

4. The conductor track configuration according to claim 2, wherein said gaps each extend over a predominant portion of one of said wiring fields.

5. The conductor track configuration according to claim 3, wherein said gaps each extend over a predominant portion of one of said wiring fields.

6. The conductor track configuration according to claim 1, wherein adjacent contacts are mutually offset forming a staggered configuration.

7. The conductor track configuration according to claim 1, wherein each three adjacent contacts are mutually staggered forming a triple staggered configuration.

8. The conductor track configuration according to claim 1, wherein said lower conductor tracks are widened into contact areas in the vicinity of said contacts.

9. The conductor track configuration according to claim 1, wherein said upper conductor tracks are widened into contact areas in the vicinity of said contacts.

10. The conductor track configuration according to claim 1, wherein said lower and upper conductor tracks are widened into contact areas in the vicinity of said contacts.

11. The conductor track configuration according to claim 1, wherein said lower and upper conductor tracks have a wavy course.

* * * * *